United States Patent [19]
Mochizuki et al.

[11] Patent Number: 5,579,279
[45] Date of Patent: Nov. 26, 1996

[54] SEMICONDUCTOR MEMORY DEVICE AND METHOD OF MANUFACTURING THE SAME

[75] Inventors: Yoshio Mochizuki; Hideo Kato, both of Kawasaki; Nobutake Sugiura, Yokohama, all of Japan

[73] Assignee: Kabushiki Kaisha Toshiba, Tokyo, Japan

[21] Appl. No.: 534,108

[22] Filed: Sep. 26, 1995

[30] Foreign Application Priority Data

Oct. 15, 1994 [JP] Japan ..................................... 6-275971

[51] Int. Cl.$^6$ ................ G11C 8/00; G11C 7/00; G11C 11/34
[52] U.S. Cl. ............. 365/230.08; 365/236; 365/200; 365/178
[58] Field of Search ............... 365/230.08, 236, 365/200, 178

[56] References Cited

U.S. PATENT DOCUMENTS

4,346,459 8/1982 Sud et al. ........................... 365/200
5,303,201 4/1994 Sakamoto ............................ 365/236

*Primary Examiner*—David C. Nelms
*Assistant Examiner*—Trong Phan
*Attorney, Agent, or Firm*—Loeb & Loeb LLP

[57] ABSTRACT

A memory system having an input buffer, an address counter, an address decoder, and a memory-cell array. Address signals are supplied to the memory-cell array. In the system, a true-address data determining section has wires or a circuit storing an internal address specific to the system. A false-data generating circuit generates false data when the internal address is in a false data area, and the false data is input to an output selecting circuit. A true-address data area detecting circuit compares the true-address data EAi with the internal address consisting of the address signals supplied from an address counter, and generates a signal REAL when the internal address is in a true-address data area. The output-selecting circuit selects the false data or the data read from the memory-cell array through a sense amplifier, in accordance with whether the signal REAL is at high level or low level. The data stored in the memory-cell array consists of true data items and false data items. Hence, even if the data is copied into a conventional semiconductor memory device, it cannot be used in practice.

17 Claims, 11 Drawing Sheets

SEMICONDUCTOR MEMORY DEVICE AND METHOD OF MANUFACTURING THE SAME

BACKGROUND OF THE INVENTION

1. Field of the Invention

The present invention relates to a semiconductor memory device, and more particularly to a ROM memory which has a novel structure and from which data can hardly be copied.

2. Description of the Related Art

The memory cell array of a semiconductor memory, such as a ROM (Read Only Memory), comprises memory cells which are MOSFETs arranged in rows an columns. Each memory cell has its gate connected to a word line which extends in a row direction and its source and drain connected to a bit line which extends in a column direction. To read data from any desired memory cell, the bit line connected to the source and drain of the memory cell is selected, and the word line connected to the gate of the memory cell is set at high potential.

How to read data from a conventional ROM memory will be explained. The memory cell array of the ROM memory comprises memory cells which are MOS transistors arranged in rows and columns. Each memory cell has its gate connected to a word line, which in turn is connected to a row decoder. Each memory cell has its drain connected to a bit line, which in turn is connected to a column decoder by a selecting transistor. The bit line is connected to the input terminal of a sense amplifier, the output of which is coupled to the input terminal of an output circuit. Upon receipt of an address, the column decoder selects one of the bit lines provided, in accordance with the address. The potential of the bit line thus selected is applied to the input terminal of the sense amplifier. Upon receipt of an address, the row decoder selects one of the word lines provided, in accordance with the address. The normal power-supply voltage is applied to the gate of the memory cell which is connected to both the selected bit line and the selected word line. As a result, data is read from this memory cell.

The conventional semiconductor device of the type has the problem that data stored in it can easily be copied.

SUMMARY OF THE INVENTION

In view of the foregoing, the present invention has been made. The object of the invention is to provide a semiconductor memory device having a specific structure which prevents practical use of data copied from the memory cells (e.g., ROM cells), and to provide a method of manufacturing this semiconductor memory device.

The present invention is characterized in that the chip stores true data and false data and that the true (effective) data and the false data are discriminated and read out when necessary.

A semiconductor memory device according to the invention comprises a plurality of memory cells arranged in rows and columns, each having a gate, a source and a drain; a plurality of word lines to which the gates of the memory cells are connected; a plurality of bits lines to which the drains of the memory cells are connected; means for applying a potential to the word lines; bit-line selecting means for selecting at least one of the bit lines to read data from at least one of the memory cells; a sense amplifier for detecting the potential of said at least one bit line selected, thereby sensing a current supplied to said at least one memory cell from which data is to be read; an output circuit for outputting an output of said sense amplifier; and nonvolatile circuit characteristics or wiring corresponding to internal addresses particular to a chip. The memory device further comprises a true-address data determining section for outputting true-address data; a true-address data area detecting circuit for comparing the true-address data output from the true-address data determining section with an internal address data and for generating a signal when the internal address data is identical to the true-address data, said signal designating whether the data stored in said at least one memory cell should be output; a false-data generating circuit for generating false data when the internal address is other than the true-address data; and an output selecting circuit for selecting either the false data or the data stored in said at least one memory cell.

The true-address data area detecting circuit may be constituted by wires. The false data may be the output of a logic circuit which receives the internal address. The false data may be output from a node by oscillating this node by an oscillator and by latching the output of the node with a data-out clock signal. Alternatively, the false data may be the output of a logic circuit which receives the internal address and the data read from a random-data ROM. A random-data ROM area may be provided in the semiconductor substrate in which the memory cells are formed, and the data stored in the random-data ROM area may be used to provide the false data. Alternatively, the false data may be the output of a random-data generating circuit.

A method of manufacturing the semiconductor memory device described above, according to the present invention, is characterized in that the true-address data is stored into MOS transistors provided in the semiconductor substrate, along with the said memory cells, and that channel ions are implanted into the MOS transistors in the same step as channel ion are implanted into the memory cells to store data thereinto.

The data stored in the memory cells consists of true data items and false data items. Therefore, the data cannot be used practically even if it is copied. Moreover, the semiconductor memory device can be manufactured easily since ions are implanted into the MOS transistors in the same step as ions are implanted into the channel regions of the memory cells.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Embodiments of the present invention will now be described, with reference to the accompanying drawings.

First, a semiconductor memory device according to the first embodiment will be described, with reference to FIGS. 1 to 10. The memory device is formed in a p-type semiconductor substrate (a chip). In operation, the memory device receives a chip enable signal /CE and an address signal.

Figures 1, 2:
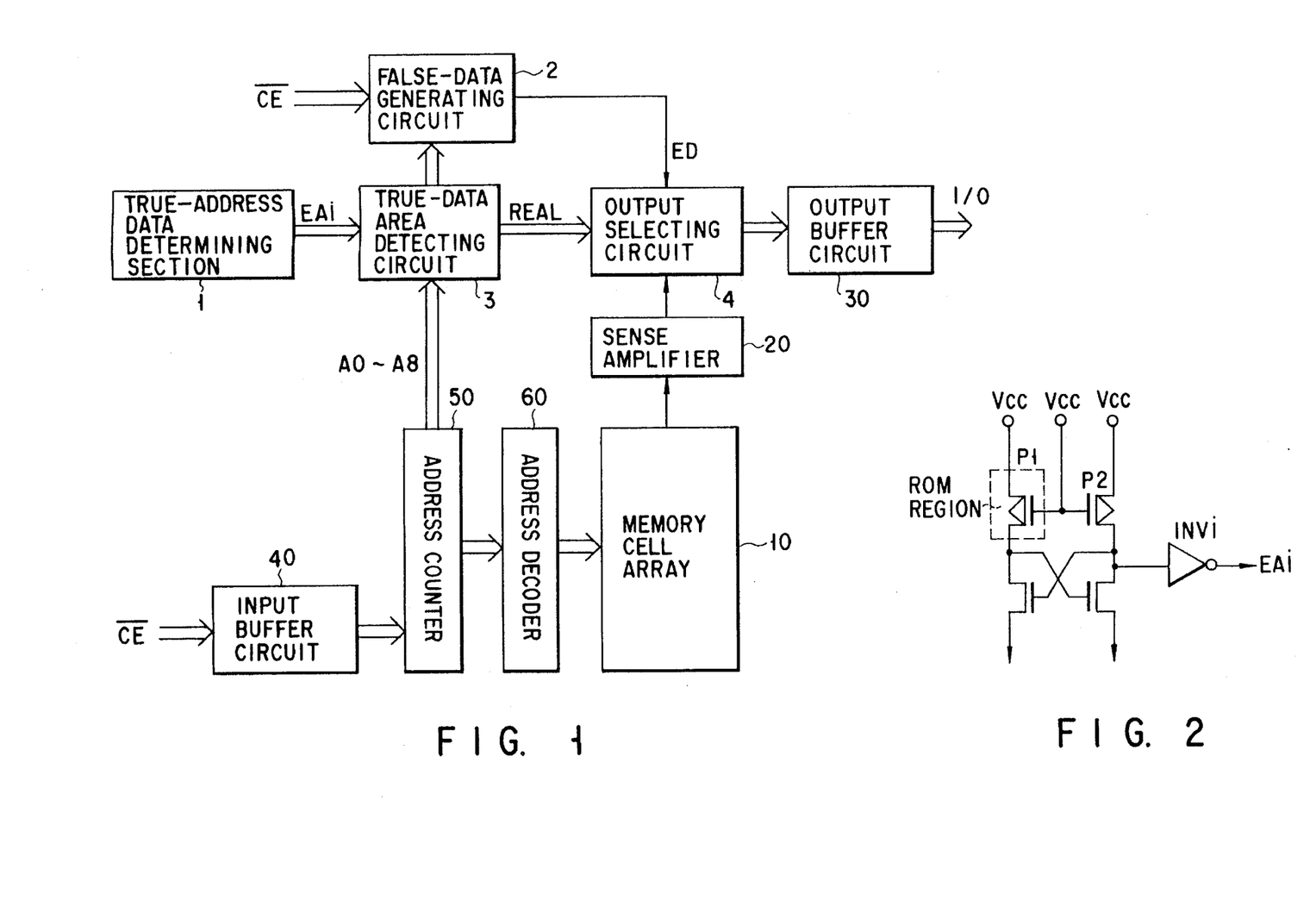
FIG. 1 is a block diagram of a semiconductor memory device according to a first embodiment of the present invention.
FIG. 2 is a circuit diagram showing an output selecting circuit provided in the first embodiment.

As shown in the block diagram of FIG. 1, the semiconductor memory device comprises a memory cell array 10, a sense amplifier 20, and an output buffer circuit 30. The memory cell array 10 comprises memory cells arranged in rows and columns, each formed of, for example, an N-channel MOS transistor. Each memory cell has its gate connected to a word line, which is connected to a row decoder (not shown). The memory cell has its drain connected to a bit line. The bit line is connected at one end by a selecting transistor (not shown) to a bit-line selecting line connected to a column decoder (not shown, either), and at the other end to an input terminal of the sense amplifier 20. The output of the sense amplifier 20 is coupled to the input terminal of the output buffer circuit 30.

The column decoder selects one of the bit lines in accordance with the address input to the memory device. The potential on the bit line thus selected is applied to the input terminal of the sense amplifier 20. In the meantime, the row decoder selects one of the word lines in accordance with the address. The power-supply voltage is applied to the gate of the memory cell which is connected to the bit line and the selected word line, both selected. As a result, data is read from this memory cell.

The semiconductor memory device further comprises an input buffer circuit 40, an address counter 50, and an address decoder 60. Thus address signals are provided to the memory cell array. It further has a true-address data determining section 1, a false-data generating circuit 2, a true-data area detecting circuit 3, and an output selecting circuit 4. These components 1, 2, 3 and 4 characterizes the present invention.

The true-address data determining section 1 has either a fixed wiring or a fixed characteristic which corresponds to the internal address specific to the chip. When the section 1 is supplied with operating power, it outputs true-address data EAi, which is supplied to the true-data area detecting circuit 3. The false-data generating circuit 2 generates false data if the internal address exits in a false data area, and supplies the false data to the output selecting circuit 4. The true-data area detecting circuit 3 compares the true-address data EAi output from the true-address data determining section 1, with the internal address which the address counter 50 has output upon receipt of the address signal. If the internal address exists in the true data area, the circuit 3 generates a signal REAL which designates whether or not data stored in the memory cell array 10 should be output from the semiconductor memory device. The signal REAL is supplied to the output selecting circuit 4. If the signal REAL is at low level, the output selecting circuit 4 selects and outputs the false data to the output buffer circuit 30. If the signal REAL is at high level, the circuit 4 selects the data read from the memory cell array 10 through the sense amplifier 20 and supplies this data to the output buffer circuit 30.

The data output from the true-data area detecting circuit 3 is supplied to the false-data generating circuit 2. If the data need not be used, the false-data generating circuit 2 may be disabled.

FIG. 2 is a circuit diagram of the true-address data determining section 1. As FIG. 2 shows, the section 1 comprises a plurality of flip-flop circuits and an inverter INVi. The flip-flop circuits are provided in the same number as the bits which form the true-address data. They are designed such that the section 1 has the fixed wiring or the nonvolatile characteristic which corresponds to the internal address specific to the chip. The inverter INVi is provided for inverting the outputs of the flip-flop circuits, thereby to output the true-address data EAi. Each flip-flop circuit includes two load PMOS transistors P1 and P2. Channel ion implantation (also known as ROM implantation) may be performed, if necessary, on one of the transistors P1 and P2, to impart a desired threshold value to that load transistor. More specifically, the ROM implantation may be effected in the ROM region shown in FIG. 2. Needless to say, ROM implantation has been carried out on the memory cells of the memory cell array 10, and each memory cell stores specific data. One of the load transistors of each flip-flop circuit incorporated in the section 1 is subjected, if necessary, to ROM implantation, along with the memory cells of the array 10. In other words, the load transistor and the memory-cell transistors are ROM-implanted in the same step. This simplifies the method of manufacturing the semiconductor memory device.

The true-address data determining section 1 outputs data of "0" or "1" in accordance with which load transistor, P1 or P2, has been ROM-implanted to have a specific threshold value. Either the transistor P1 or the transistor P2 may be short-circuited by an aluminum wire, instead of being ROM-implanted.

Figure 3:
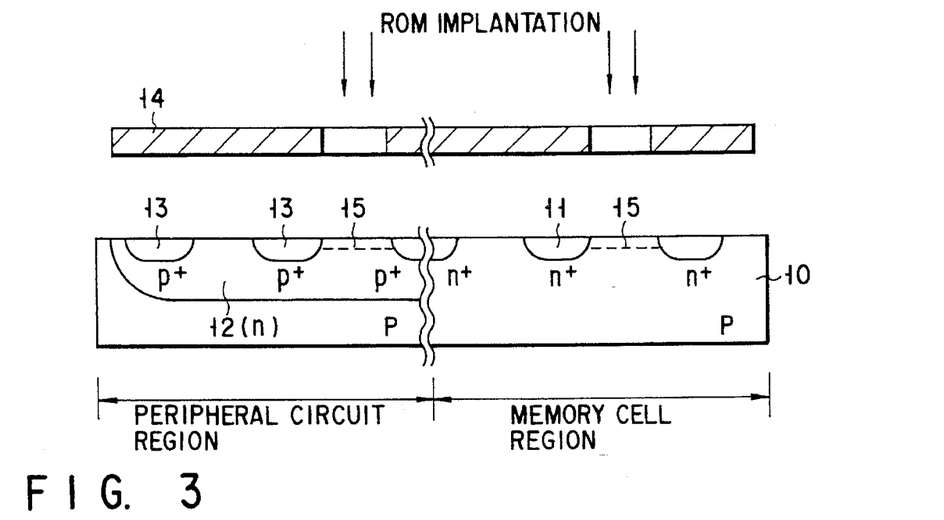
FIG. 3 is a sectional view explaining a step of manufacturing the first embodiment.

How ROM implantation is performed on the memory cells of the array 10 and one of the load transistors of each flip-flop circuit (FIG. 2) will be explained, with reference to FIG. 3. FIG. 3 is a sectional view showing the memory cell region and the peripheral circuit region, both provided in the p-type silicon substrate 10.

As shown in FIG. 3, the memory-cell region of the silicon substrate 10 has an $n^+$ source/drain region 11, and the peripheral circuit region has an n-type well region 12. $P^+$ source/drain regions 13 are provided in the n-type well region 12. A gate insulating film (not shown) is formed on the surface of the silicon substrate 10. Then, ions are implanted into selected parts of the substrate 10 under a predetermined acceleration voltage, by using a ROM data mask 14. As a result, channel regions 15 are formed in the surface of the silicon substrate 10. Thereafter, gates of polysilicon are formed, thereby making memory cells and transistors.

Figure 4:
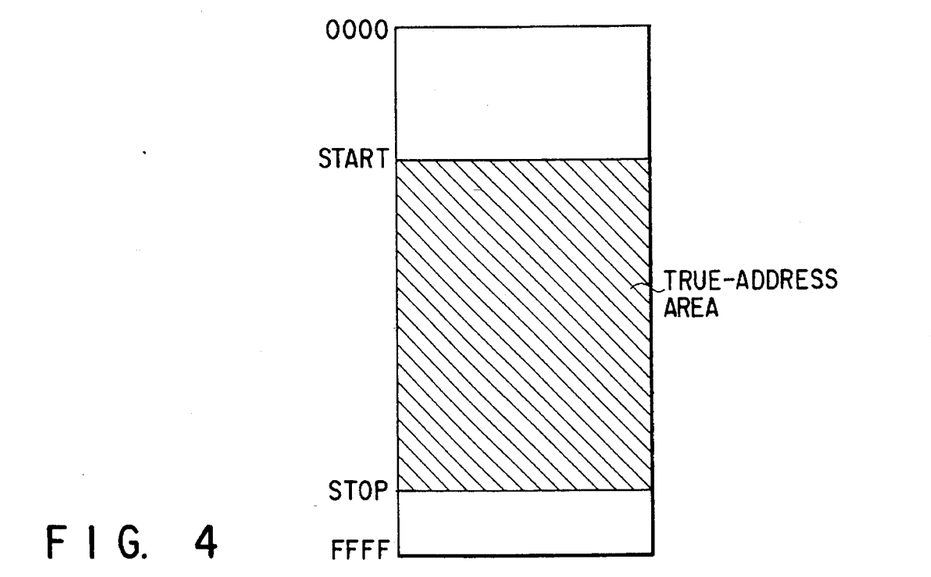
FIG. 4 is the address map of a semiconductor memory device in the first embodiment.

FIG. 4 schematically shows the address map of the semiconductor memory device into which data has been written. The area shaded in FIG. 4 indicates the true-address area. This area is detected by the true-data area detecting circuit 3, which will be described with reference to FIGS. 5, 6 and 7.

Figure 6:
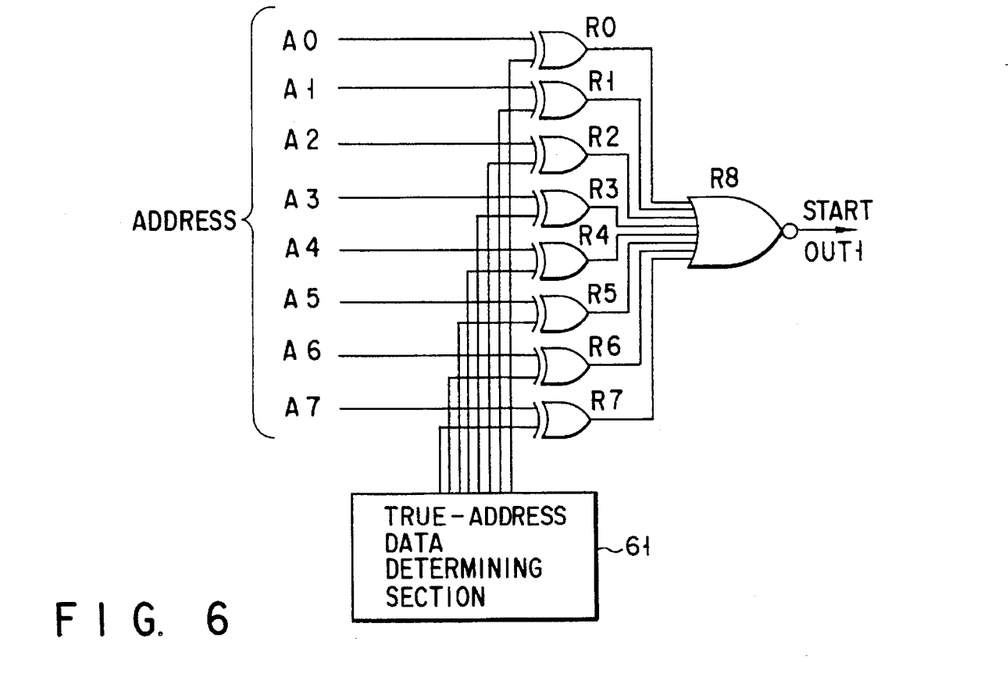
FIG. 6 is a circuit diagram showing another component of the true-data area detecting circuit.

As shown in FIG. 6, the true-data area detecting circuit 3 comprises exclusive OR gates R0 to R7 and a NOR logic gate R8. Internal address bits A0 to A7 are input to the exclusive OR gates R0 to R7. Also input to the exclusive OR gates R0 to R7 is the true-address data EAi output from the true-address data determining section 61. The outputs of the exclusive OR gates A0 to A7 are input to the NOR logic gate R8. The NOR logic gate R8 generates a first output OUT 1 (i.e., a pulse START).

Figure 7:
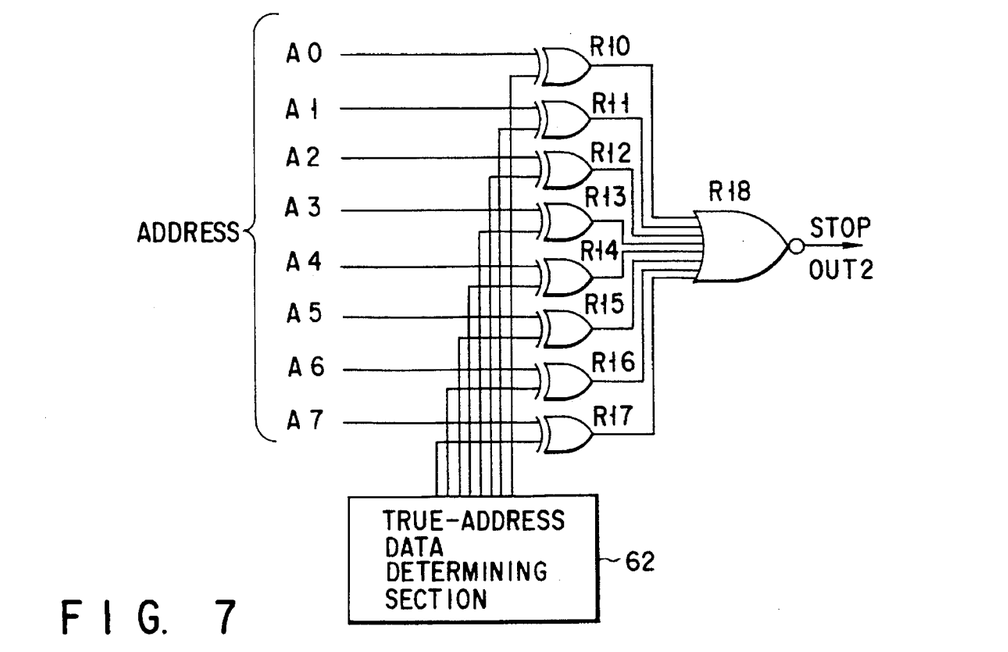
FIG. 7 is a circuit diagram showing still another component of the true-data area detecting circuit.

As shown in FIG. 7, the true-data area detecting circuit 3 further comprises exclusive OR gates R10 to R17 and a NOR logic gate R18. Internal address bits A0 to A7 are input to the exclusive OR gates R0 to R7. Also input to the exclusive OR gates R0 to R7 is the true-address data EAi output from the true-address data determining section 62. The outputs of the exclusive OR gates A10 to A17 are input to the NOR logic circuit R18. The NOR logic circuit R18 generates a second output OUT 2 (i.e., a pulse STOP).

Figure 5:
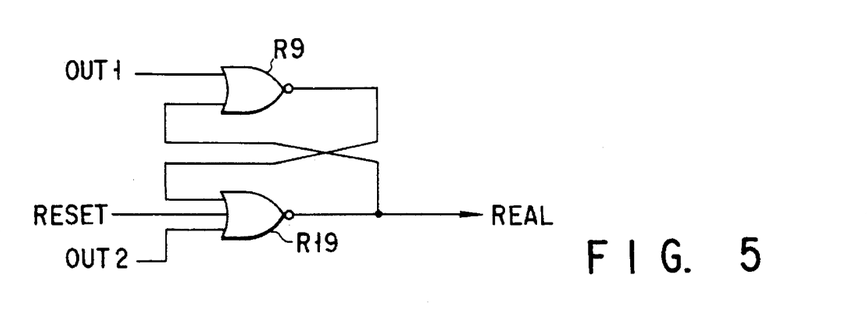
FIG. 5 is a circuit diagram illustrating a component of the true-data area detecting circuit incorporated in the first embodiment.

The true-data area detecting circuit 3 still further comprises two NOR logic gates R9 and R19, as is illustrated in FIG. 5. The first output OUT1 and the second output OUT 2 are input to the NOR logic gates R9 and R19, respectively. The output of the NOR logic gate R9 is input to the NOR logic gate R19, the output of the NOR logic gate R19 is input to the NOR logic gate R9, and a reset signal is input to the NOR logic gate R19. Therefore, the NOR logic gates R9 and R19 constitute a flip-flop circuit. The output of this flip-flop circuit is the above-mentioned signal REAL, which designates whether or not data stored in the memory cell array 10 should be output from the semiconductor memory device.

The true-data area detecting circuit 3 selects an input signal which is generated when the internal address (bits A0 to A7) is identical to the true-address data EAi stored in the ROM-implanted transistors and output from the true-address determining section 1. More precisely, the NOR logic gate R8 generates the first output OUT1 from the outputs of the exclusive OR gates R0 to R7 each of which outputs "0" when the corresponding bits of the internal address and the true-address data coincides and outputs "1" when these bits are not identical, while the NOR logic gate R18 generates the second output OUT2 from the outputs of the exclusive OR gates R10 to R17 each of which outputs "0" when the corresponding bits of the internal address and the true-address data coincides and outputs "1" when these bits are not identical. The flip-flop circuit constituted by the NOR logic gates R9 and R19 sets the signal REAL at high level when it receives the pulse START and sets it at low level when it receives the pulse STOP.

Figure 8:
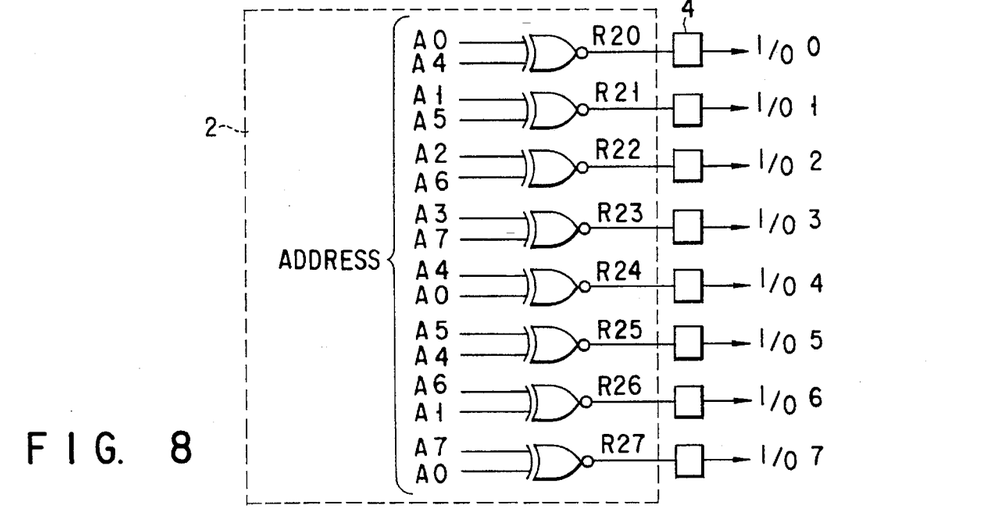
FIG. 8 is a diagram of the false-data generating circuit provided in the first embodiment.

The false-data generating circuit 2 will be described in detail, with reference to FIG. 8. As FIG. 8 shows, the circuit 2 comprises exclusive NOR gates R20 to R27 which are provided in the same number as the bits forming the address data. Two different address bits are input to each of the exclusive NOR gates R20 to R27. Each exclusive NOR gate outputs "1" when the two input bits have the same value and "0" when the two input bits have different values. The output of each exclusive NOR gate is supplied to the output selecting circuit 4.

Figures 9, 11:
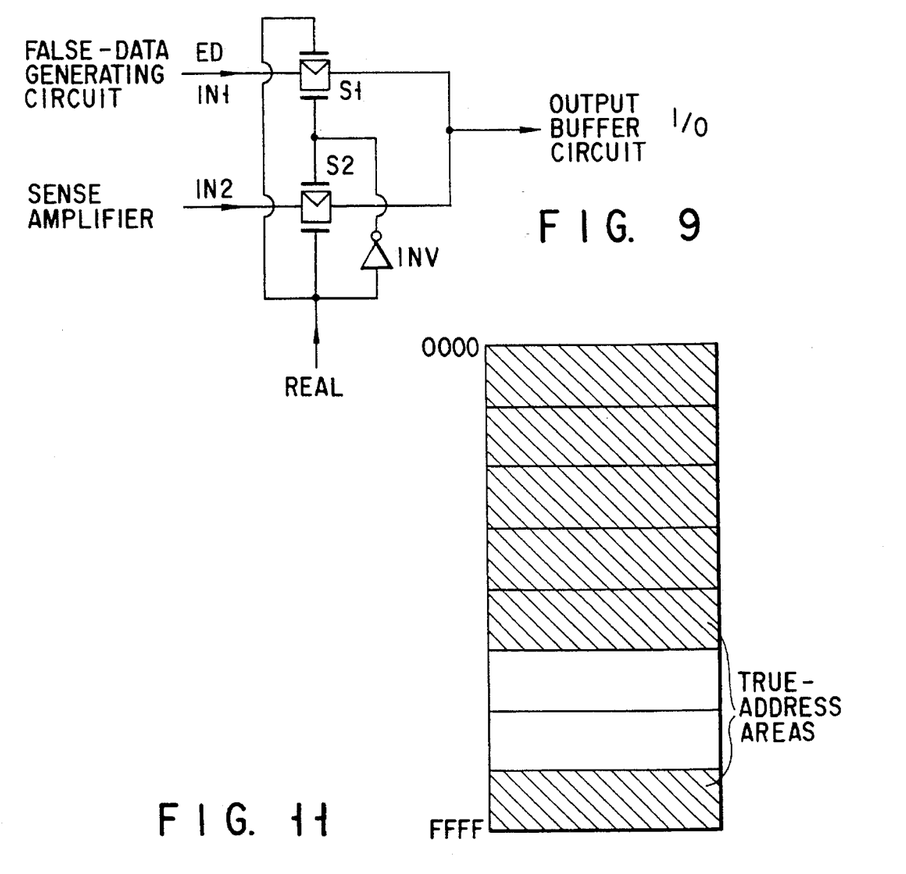
FIG. 9 is a diagram showing the output selecting circuit incorporated in the first embodiment.
FIG. 11 is the address map for a semiconductor memory device according to a second embodiment of the invention.

FIG. 9 is a diagram showing the output selecting circuit 4. As shown in the figure, the output selecting circuit 4 comprises two input terminals IN1 and IN2, output-selecting elements S1 and S2, and an inverter INV. The output ED of the false-data generating circuit 2 is supplied to the first input terminal IN1, and the internal address data sensed by the sense amplifier 20 is supplied to the second input terminal IN2. The elements S1 and S2 constitute, for example, a 2-channel multiplexer. The inverter INV is provided to invert the signal REAL output from the true-data area detecting circuit 3. The output selecting circuit 4 selects the false data output from the false-data generating circuit 2 or the true data output from the sense amplifier 20, in accordance with the level of the signal REAL generated by the true-data area detecting circuit 3. When the signal REAL is at low level, the switch at the first input terminal IN1 opens. When the signal REAL is at high level, the switch at the second input terminal IN2 opens, whereby the true data is output to the output buffer circuit 30.

It is the chip enable signal /CE that drives the memory system of the semiconductor memory device. How the memory system operates will be explained with reference to FIG. 10.

Figure 10:
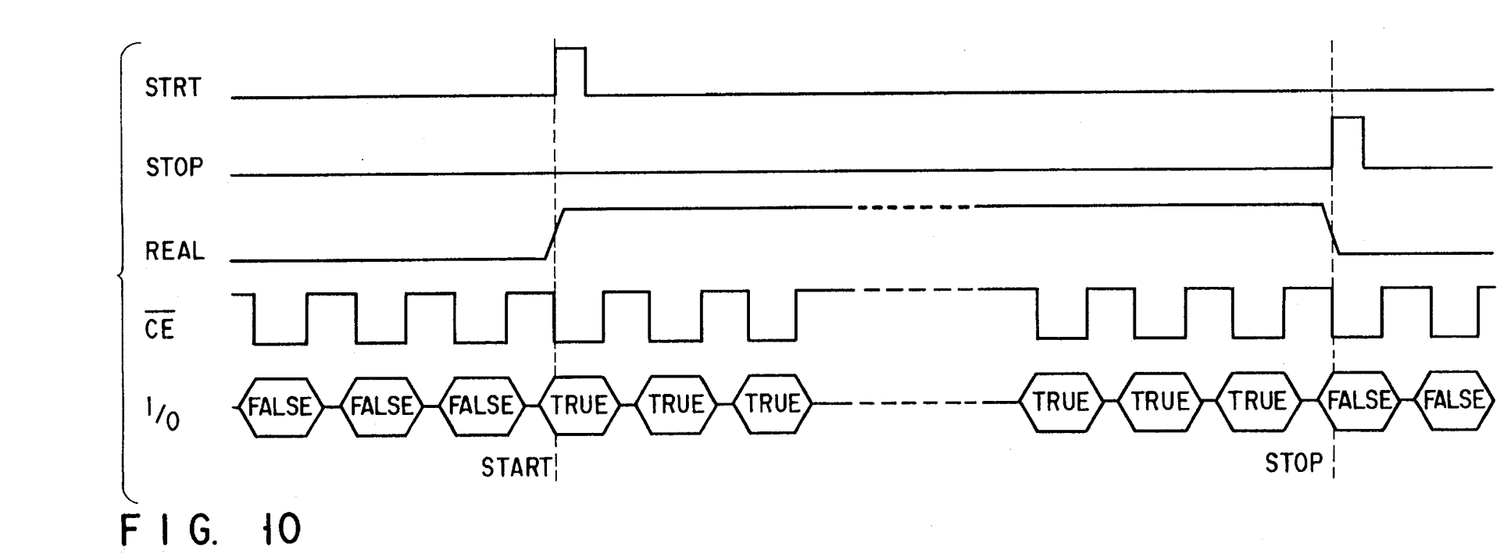
FIG. 10 is a timing chart representing the waveforms of signals, explaining the operation of the first embodiment.

As shown in FIG. 10, the chip enable signal /CE is a square-wave signal. As the signal /CE is supplied from the input buffer circuit 40 to the address counter 50, the address counter 50 supplies address signals (A0 to A8 to the address decoder 60 as shown in FIG. 1. The address signals are supplied also to the true-data area detecting circuit 3 as shown in FIG. 1, too.

When the power-supply voltage (Vcc) is applied to the true-address data determining section 1, the section 1 outputs the true-address data EAi stored in the ROM-implanted transistors. At the time the first pulse of the chip enable signal /CE is supplied to the circuit 3, the signal REAL, which is the output of the true-data area detecting circuit 3, is at low level in the area other than the true-address area shown in FIG. 4. Thus, the output selecting circuit 4 selects the data output from the false-data generating circuit 2 in accordance with the signal REAL.

Therefore, the false data that is output from the output buffer circuit 30 to the output terminal I/O. As the chip enable signal /CE is further supplied to the true-data area detecting circuit 3, the internal address enters the true-address area shown in FIG. 4. When the internal address is found to be data identical to the address EAi output from the true-address data determining section 1, the NOR logic gate R8 incorporated in the true-data area detecting circuit 3 generates the first output OUT1, i.e., pulse START. The pulse START is input to the flip-flop circuit constituted by the NOR logic gates R9 and R19 (FIG. 5). The output signal REAL of the flip-lop circuit is thereby set at high level. In response to the signal REAL at high level, the output selecting circuit 4 selects the data supplied from the sense amplifier 20, though it has been selecting the false data supplied from the false-data generating circuit 2 until the signal REAL rises to the high level. Thus, the circuit 4 outputs the true data.

As the chip enable signal /CE is further supplied to the address counter 50, the signal REAL finally reaches the end of the true-address area shown in FIG. 4. At this moment, the internal address is found to be identical to the address EAi, the NOR logic gate R18 incorporated in the true-data area detecting circuit 3 generates the second output OUT2, i.e., pulse STOP. The pulse STOP is input to the flip-flop circuit (FIG. 5). The output signal REAL of the flip-lop circuit is thereby set at low level. In response to the signal REAL at low level, the output selecting circuit 4 selects the data supplied from the false-data generating circuit 2.

Thus, true data is read from the true-address area of the address map shown in FIG. 4, while false data is read from the other area of the address map. The data stored in the memory chip, even if copied, cannot be used practically since it consists of true data items and false data items.

In addition, the semiconductor memory device according to the first embodiment can be manufactured easily since, as described above, the load transistor and the memory-cell transistors are ROM-implanted in the same step.

A semiconductor memory device according to a second embodiment of the invention will be described, with reference to FIGS. 11 to 14. The second embodiment is generally identical, in structure, to the first embodiment shown in FIG. 1. The components identical or similar to those of the first embodiment will be designated by the same reference numerals in the following description.

FIG. 11 shows the address map of the second embodiment. The areas shaded in FIG. 4 indicate the true-address areas. The address map is characterized in that some of which are spaced apart from the others. For this particular address map, the true-data area detecting circuit 3 can be constituted by a simple logic circuit. A discontinuous true-address area can be constituted by decoding this logic circuit.

Figure 12:
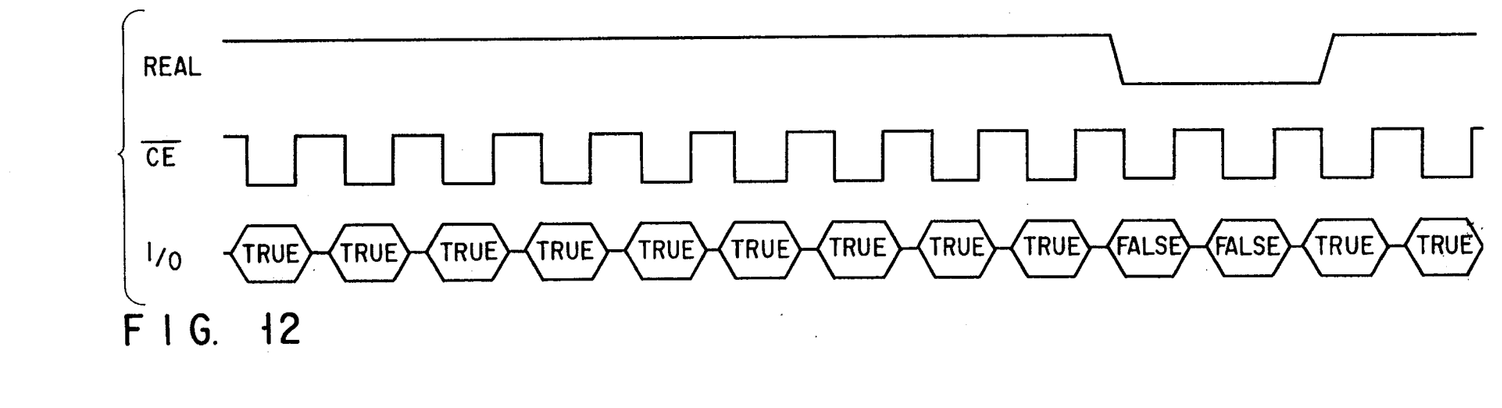
FIG. 12 is a timing chart illustrating the waveforms of signals, explaining the operation of the second embodiment.

A chip enable signal /CE having the waveform shown in FIG. 12 is supplied to the false-data generating circuit 2. At the first pulse of the chip enable signal /CE, the address signals A0 to A7 are supplied from the address counter 50 to the address decoder 60, thereby starting the data-reading operation. The address signals A0 to A7 are supplied to the true-data area detecting circuit 3, too.

Figure 14:
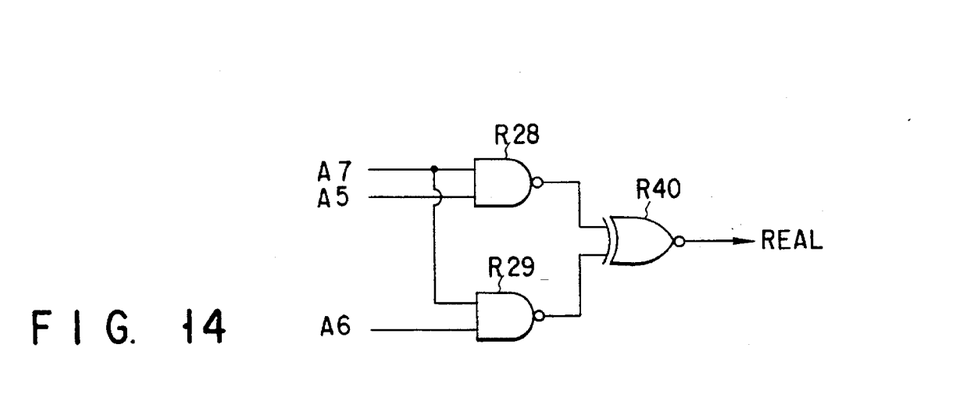
FIG. 14 is a diagram illustrating the circuit provided in the second embodiment, for detecting a true-data area.

The true-data area detecting circuit 3 will be described in detail, with reference to FIG. 14. As shown in FIG. 14, the circuit 3 comprises 2-input NAND gates R28 and R29 and one exclusive NOR gate R40. Address-data signals A7 and A5 are supplied to the first and second input terminals of the first NAND gate R28, and address-data signals A7 and A6 to the first and second input terminals of the second NAND gate R29, respectively. The outputs of the NAND gates R28 and R29 are input to the exclusive OR gate R40. The exclusive OR gate R40 generates a signal REAL, which is supplied to the output selecting circuit 4. The signal REAL designates whether or not data stored in the memory cell array 10 should be output from the semiconductor memory device. The signal REAL is supplied to the output selecting circuit 4.

The signal REAL is at low level when the chip enable signal /CE is in other than true address area shown in the address map. Thereby, the output selecting circuit 4 selects the data output from the false-data generating circuit 2 in accordance with the signal REAL. As a result, the false data is output via the output buffer circuit 30 to the output terminal I/O (FIG. 1).

As the chip enable signal /CE is further supplied to the address counter 50, the signal enters the first true-address area shown in FIG. 11. The signal REAL is thereby set at high level. In response to the signal REAL at high level, the output selecting circuit 4 selects the data supplied from the sense amplifier 20. In other words, the circuit 4 outputs the true data.

As the chip enable signal /CE is still further supplied to the address counter 50, the signal enters a false data area from the first true-address area and is set at low level. The output selecting circuit 4 selects the false data supplied from the false-data generating circuit 2. The false data is output via the output selecting circuit 4 to the output terminal I/O (FIG. 1).

Thus, true data is read from each true-address area of the address map shown in FIG. 11, while false data is read from the false data area of the address map. The data stored in the memory chip, even if copied, cannot be used practically since it consists of true data items and false data items.

Figure 13:
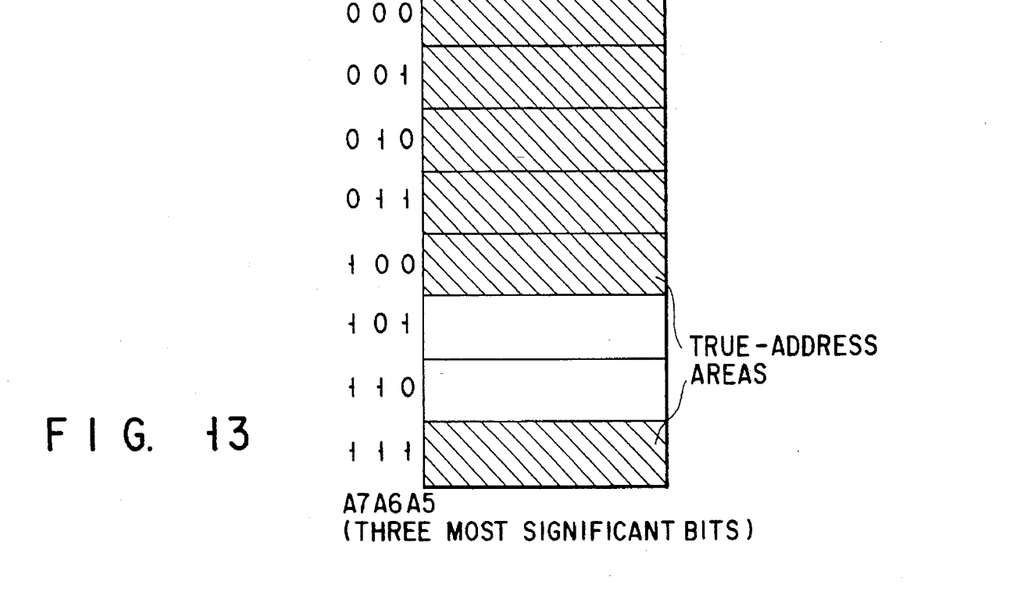
FIG. 13 is another address map for the second embodiment.

In the second embodiment, the three most significant bits (A5, A6 and A7) of the address can be used to designate one of the true-data areas of the address map, as can be understood from FIG. 13. Hence, the semiconductor memory device according to the second embodiment does not need a true-address data determining section. The semiconductor memory device is therefore more simple than the device (FIG. 1) according to the first embodiment.

A semiconductor memory device according to a third embodiment of the invention will be described. The third embodiment is characterized in that the false-data generating circuit has the structure shown in FIG. 15.

Figure 15:
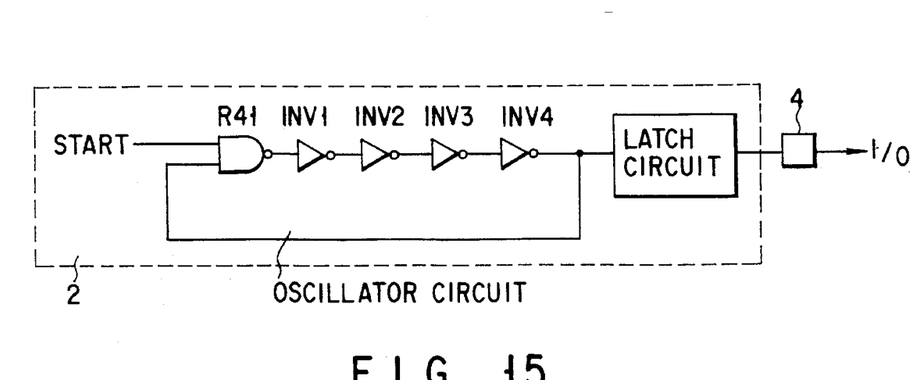
FIG. 15 is a diagram illustrating the circuit false-data generating circuit used in a semiconductor memory device according to a third embodiment of the present invention.

As illustrated in FIG. 15, the false-data generating circuit 2 has an oscillator circuit and a latch circuit. The oscillator circuit comprises one NAND gate R41 and four inverters INV1 to INV4. The inverters INV1 to INV4 are connected in series, with the first inverters INV1 coupled to the output of the NAND gate R41 which as an input receiving the pulse START from TRUE-DATA AREA DETECTING circuit 3. In the oscillator circuit, a given node is oscillated, generating a signal. The latch circuit latches the signal in accordance with a data-output clock signal (now shown). The output of the latch circuit is supplied as false data to the output terminal I/O through the output selecting circuit 4 and the output buffer circuit 30.

A semiconductor memory device according to a fourth embodiment of the invention will be described. The false-data generating circuit 2 of the fourth embodiment is similar to its counterpart of the first embodiment, which is illustrated in FIG. 8.

Figure 16:
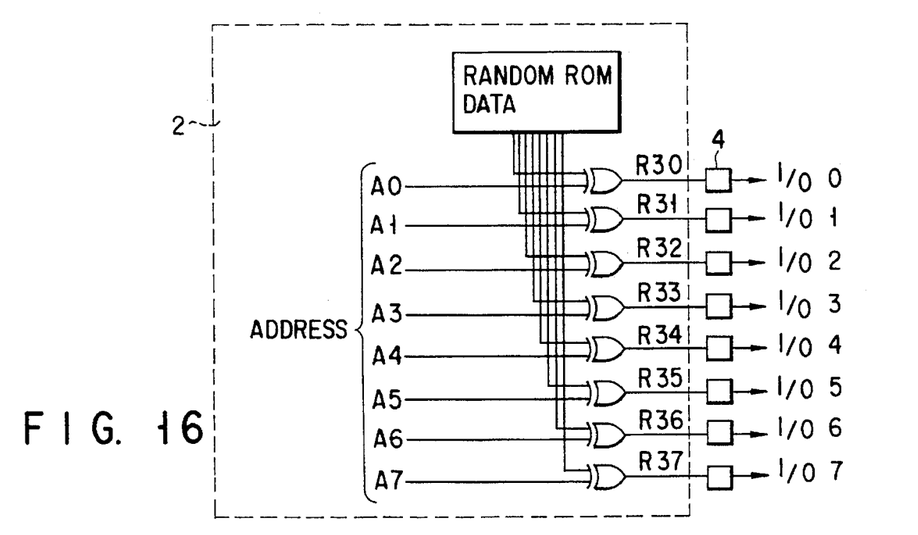
FIG. 16 is a diagram showing the circuit false-data generating circuit used in a semiconductor memory device which is a fourth embodiment of the invention.

As shown in FIG. 16, the false-data generating circuit 2 comprises eight 2-input exclusive OR gates R30 to R37. Eight bits A0 to A7 of the internal address are supplied to the first inputs of the exclusive OR gates R30 to R37, respectively. Eight bits forming random ROM data are externally supplied to the second inputs of the exclusive OR gates R30 to R37, respectively. The false data generated by the false-data generating circuit 2 is supplied to the output terminal I/O via the output selecting circuit 4. The false data is more random than the false data generated by the false-data generating circuit 2 illustrated in FIG. 8.

Figures 17, 18:
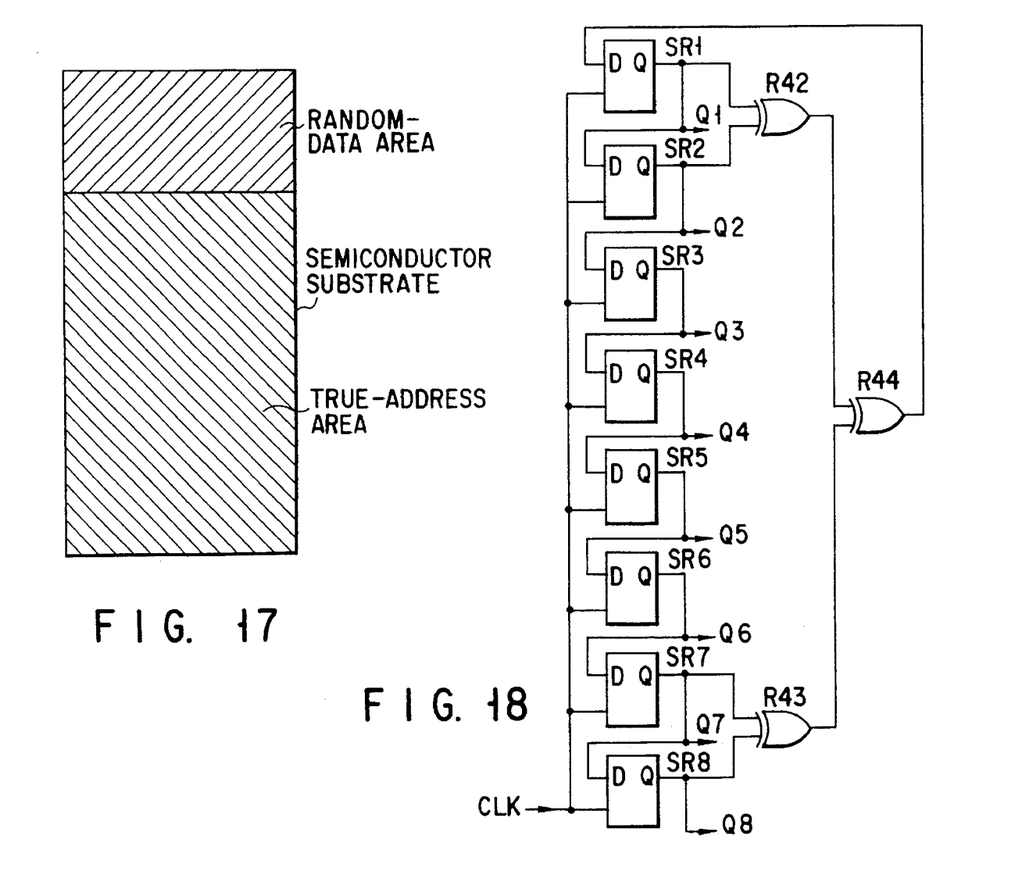
FIG. 17 is an address map for false-data generation of a semiconductor memory device according to a fifth embodiment of the present invention.
FIG. 18 is a diagram illustrating the false-data generating circuit used in a semiconductor memory device which is a sixth embodiment of this present invention.

A semiconductor memory device, which is a fifth embodiment of the invention, will be described with reference to FIG. 17. FIG. 17 is a plan view of the semiconductor substrate of the memory device.

As seen from FIG. 17, the semiconductor substrate (i.e., chip) has a true-address area and a random-data area. The data stored in the random-data area is read and input as false data to the output selecting circuit incorporated in the semiconductor memory. Although the chip area is relatively large, the false data read from the random-data area is extremely random.

A semiconductor memory device according to a sixth embodiment of the invention will be described. The sixth embodiment is characterized in that the false-data generating circuit comprises the random-data generating circuit illustrated in FIG. 18.

As shown in FIG. 18, the random-data generating circuit comprises eight shift registers SR1 to SR8 and three exclusive OR gates R42, R43 and R44. The output of the exclusive OR gate R44 is fed back to the D input of the first shift register SR1. When driven by a clock signal CLK produced from a chip enable signal /CE, the shift registers SR1 to SR8 output Q1 to Q8, which form random data. The random data is output through the output buffer circuit 30.

The true-data area detecting circuit 3 incorporated in the first embodiment (FIG. 1) will be described in more detail, with reference to FIGS. 19 and 20.

As described above, the true-data area detecting circuit 3 is designed to detect the true-data area (shaded area) of the address map shown in FIG. 4. The circuit 3 has the structure illustrated in FIG. 19.

Figure 19:
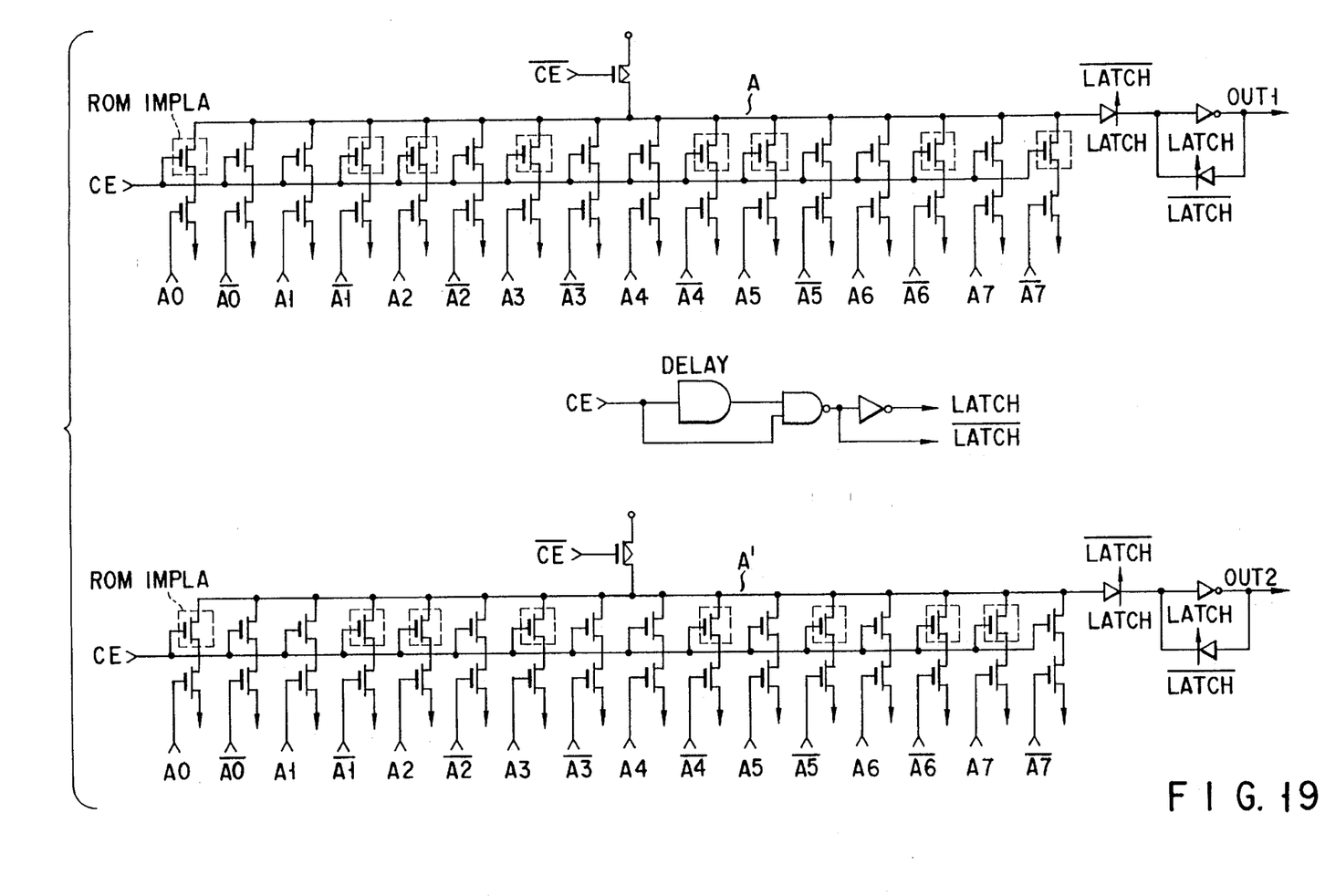
FIG. 19 is a detailed diagram showing the true-data area detecting circuit incorporated in the first embodiment of the present invention.
Figure 20:
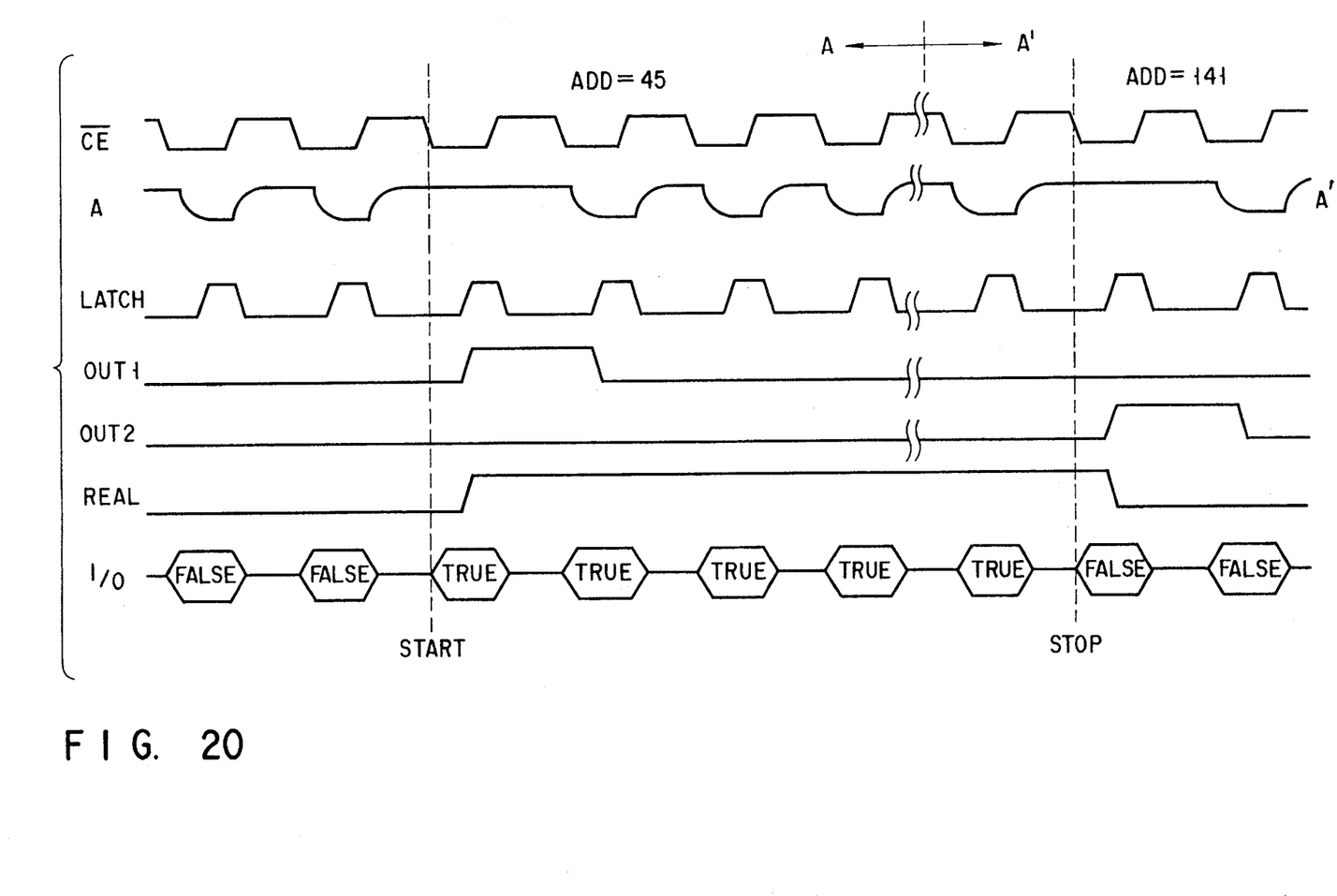
FIG. 20 is a timing chart representing the waveforms of signals, explaining the operation of the second embodiment.

As can be understood from FIG. 19, the selected transistors of the circuit 3 are ROM-implanted. When the memory device is driven by the chip enable signal /CE, an internal address data is input to the true-data area detecting circuit 3. If the internal address (A0 to A7) is identical to the data stored in ROM-implanted transistors, i.e., {10110100}, the potential at the node A remains at high level, not falling to low level. This is because all transistors are turned off. (Usually, however, at least one of the transistors is turned on, and the potential at the node A falls to low level.) Therefore, the circuit 3 generates the first output OUT1. As a result, the output signal REAL of the circuit 3 rises to high level. When any other internal address is identical to address data stored in the lower circuit of ROM-implanted transistors, i.e., {10110001}, the potential at the node A' remains at high level, not falling to low level. The circuit 3 then generates the second output OUT2, whereby the output signal REAL of the circuit 3 rises to low level.

A semiconductor memory device according to a seventh embodiment of the invention will be described, with reference to FIGS. 21 and 22. The seventh embodiment is characterized in that the signal REAL is set at high level when two address data items, not only one as in the first embodiment, are identical to the true address data.

Figure 21:
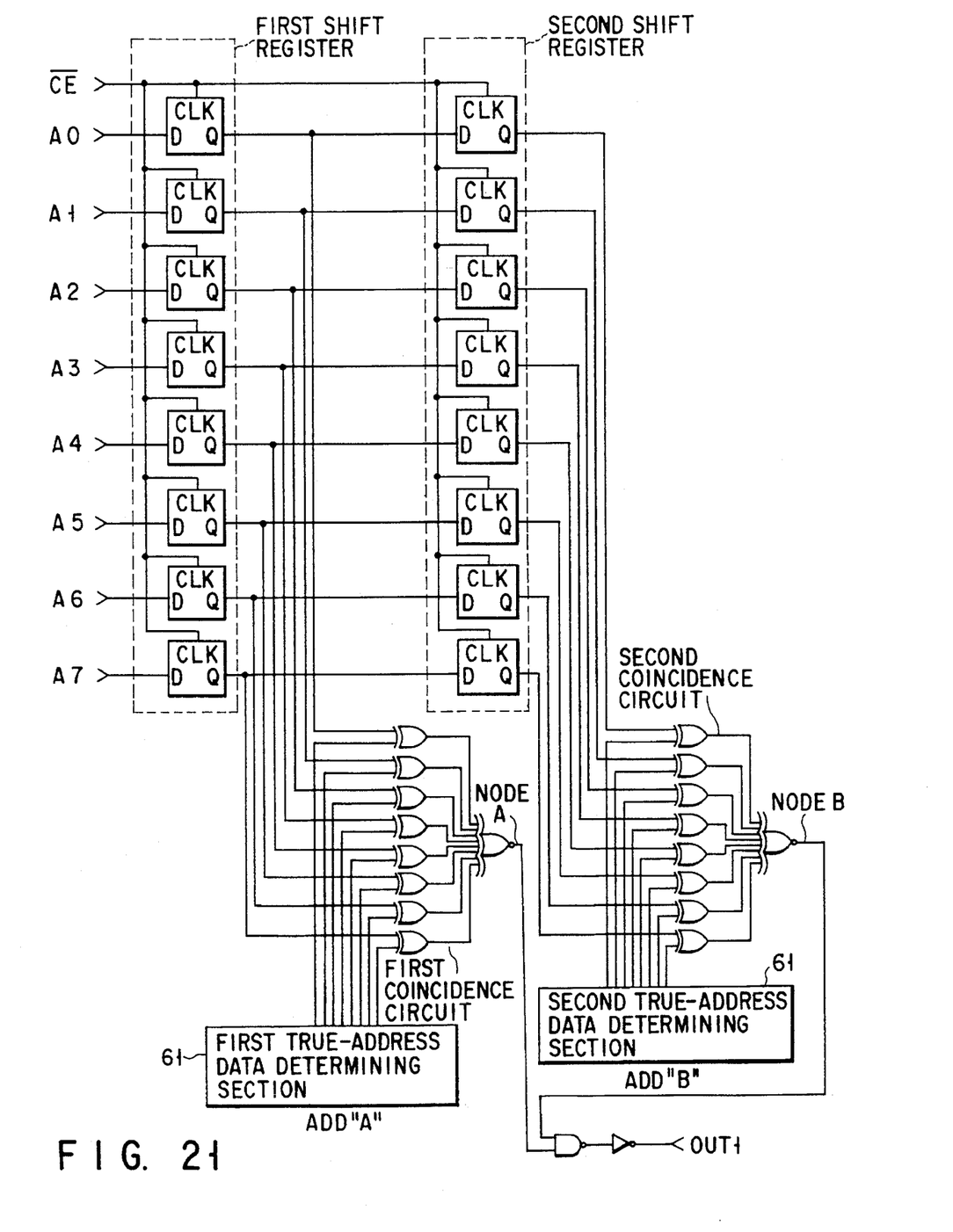
FIG. 21 is a diagram showing the false-data generating circuit used in a semiconductor memory device according to a seventh embodiment of this present invention.
Figure 22:
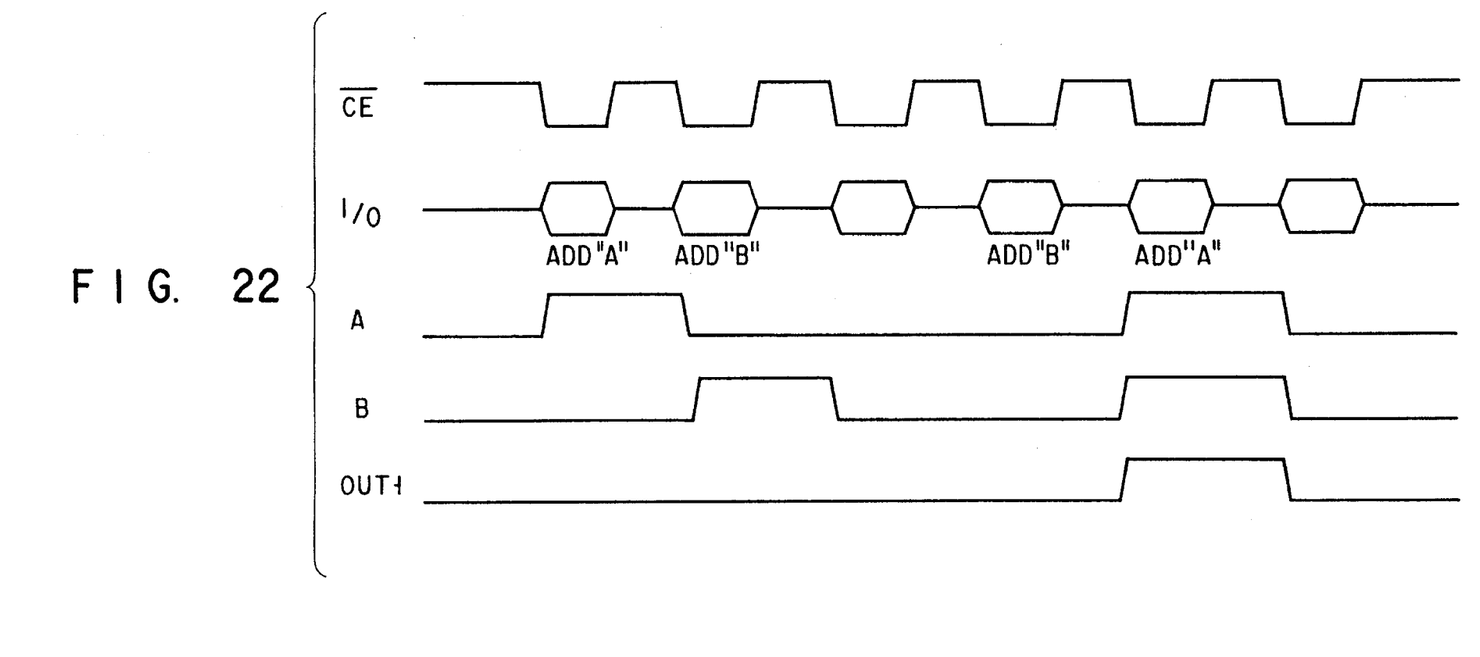
FIG. 22 is a timing chart illustrating the waveforms of signals, explaining the operation of the seventh embodiment.

As illustrated in FIG. 21, the seventh embodiment comprises two shift registers, two coincidence circuits, and two true-address data determining sections. The address-bit lines are connected to a first shift register. The outputs of the first register are connected to a first coincidence circuit and also to the second shift register. The outputs of the second shift register are connected to the second coincidence circuit. The outputs of the first true-address data determining section are connected to the first coincidence circuit, and the outputs of the true-address data determining section to the second coincidence circuit.

The operation of the seventh embodiment will be explained, with reference to FIG. 22 which is a timing chart illustrating the waveforms of signals. The first true-address data determining section stores address A, and the second true-address data determining section stores address B. When addresses A and B are externally input in the order mentioned, the nodes A and B are not set at high level at the same time. In this case, the output signal OUT1 is remains low level as is shown in FIG. 22. When the addresses B and A are externally input in this order, the nodes A and B are simultaneously set at high level, whereby the output signal OUT1 rises to high level as illustrated in FIG. 22. In other words, the seventh embodiment outputs the data stored in its memory cells only if the two externally input, consecutive addresses are identical to the internal true-address data items. The seventh embodiment is, therefore, excellent in terms of data security.

As has been described above, each semiconductor memory device according to the present invention stores data which consists of true data items and false data items. Hence, the data, even if copied, cannot be used in practice. Moreover, the semiconductor memory device can be manufactured easily since, as described above, the load transistor and the memory-cell transistors are ROM-implanted in the same step.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:

a plurality of memory cells arranged in rows and columns, each having a gate, a source and a drain;

a plurality of word lines to which the gates of said memory cells are connected;

a plurality of bit lines to which the drains of said memory cells are connected;

means for applying a potential to said word lines;

bit-line selecting means for selecting at least one of said bit lines to read data from at least one of said memory cells;

a sense amplifier for detecting a potential of said at least one bit line selected, thereby sensing a current supplied to said at least one memory cell from which data is to be read;

an output circuit for outputting an output of said sense amplifier;

a true-address data determining section for outputting true-address data, said true-address data determining section having nonvolatile circuit characteristics or wiring corresponding to an internal address particular to a chip;

a true-address data area detecting circuit for comparing the true-address output from the true-address data determining section with internal address data and for generating a signal when the internal address data is identical to the true-address data, said signal designating whether the data stored in said at least one memory cell should be output;

a false-data generating circuit for generating false data when the internal address data is other than the true-address data; and an output selecting circuit for selecting the false data or the data stored in said at least one memory cell.

2. The semiconductor memory device according to claim 1, wherein said true-address data area detecting circuit is constituted by wires.

3. The semiconductor memory device according to claim 1, wherein said true-address data determining section has a plurality of flip-flop circuits, each comprising MOS transistors, and channel ions have been implanted into at least one of the MOS transistors of of each flip-flop circuit, thereby imparting a threshold value to the MOS transistor.

4. The semiconductor memory device according to claim 1, wherein the false data is an output of a logic circuit which receives the internal address data.

5. The semiconductor memory device according to claim 1, wherein the false data is output from a node by oscillating the node by an oscillator and by latching the output of the node in accordance with a data-out clock signal.

6. The semiconductor memory device according to claim 1, wherein the false data is an output of a logic circuit which receives the internal address data and data read from a random-data ROM.

7. The semiconductor memory device according to claim 1, wherein said memory cells are provided in a semiconductor substrate, a random-data ROM area is provided in the semiconductor substrate, and the false data is data read from the random-data ROM.

8. The semiconductor memory device according to claim 1, wherein the false data is an output of random-data generating circuit.

9. The semiconductor memory device according to claim 1, wherein said true-address data area detecting circuit has a plurality of MOS transistors, each of which has a threshold value determined by implanting channel ions into a part of the MOS transistor, and determining that the internal address data is in a true-address area when the internal address data designates a MOS transistor into which channel ions have been implanted.

10. The semiconductor memory device according to claim 1, wherein said true-address data area detecting circuit has a first circuit for storing an address valid for a previous cycle and a second circuit for generating a signal determining whether the data stored in said memory cells should be output, when externally input consecutive address data items are identical to the address stored in data stored in the first circuit.

11. The semiconductor memory device according to claim 2, wherein said true-address data determining section has a plurality of flip-flop circuits, each comprising MOS transistors, and channel ions have been implanted into any one of the MOS transistors, thereby imparting a threshold value to the MOS transistors.

12. The semiconductor memory device according to claim 2, wherein the false data is an output of a logic circuit which receives said internal address data.

13. The semiconductor memory device according to claim 2, wherein the false data is output from a node by oscillating the node by an oscillator and by latching the output of the node with a data-out clock signal.

14. The semiconductor memory device according to claim 2, wherein the false data is an output of a logic circuit which receives the internal address data and data read from a random-data ROM.

15. The semiconductor memory device according to claim 2, wherein said memory cells are provided in a semiconductor substrate, a random-data ROM area is provided in the semiconductor substrate, and the false data is data read from the random-data ROM.

16. The semiconductor memory device according to claim 2, wherein the false data is an output of random-data generating circuit.

17. A method of manufacturing a semiconductor memory device according to any one of claims 1 to 16, wherein the true-address data is stored into MOS transistors provided in the semiconductor substrate, along with the said memory cells, and that channel ions are implanted into the MOS transistors in the same step as channel ion are implanted into the memory cells to store data thereinto.

* * * * *